(12) United States Patent
Vardeny et al.

(10) Patent No.: US 9,444,065 B2
(45) Date of Patent: Sep. 13, 2016

(54) π-CONJUGATED HEAVY-METAL POLYMERS FOR ORGANIC WHITE-LIGHT-EMITTING DIODES

(75) Inventors: Zeev Valentine Vardeny, Salt Lake City, UT (US); Leonard Wojcik, Holladay, UT (US); Tomer Drori, Salt Lake City, UT (US)

(73) Assignee: The University of Utah Research Foundation, Salt Lake City, UT (US)

( * ) Notice: Subject to any disclaimer, the term of this patent is extended or adjusted under 35 U.S.C. 154(b) by 1164 days.

(21) Appl. No.: 12/300,416

(22) PCT Filed: May 14, 2007

(86) PCT No.: PCT/US2007/068858
§ 371 (c)(1),
(2), (4) Date: Mar. 19, 2009

(87) PCT Pub. No.: WO2007/134280
PCT Pub. Date: Nov. 22, 2007

(65) Prior Publication Data
US 2009/0310332 A1  Dec. 17, 2009

Related U.S. Application Data

(60) Provisional application No. 60/799,893, filed on May 12, 2006, provisional application No. 60/799,891, filed on May 12, 2006.

(51) Int. Cl.
*H01L 51/50* (2006.01)
*H01L 51/00* (2006.01)
*H05B 33/14* (2006.01)

(52) U.S. Cl.
CPC ....... *H01L 51/5036* (2013.01); *H01L 51/0035* (2013.01); *H01L 51/0085* (2013.01); *H01L 51/0087* (2013.01); *H05B 33/14* (2013.01); *C09K 2211/1425* (2013.01); *C09K 2211/185* (2013.01); *H01L 51/5016* (2013.01)

(58) Field of Classification Search
CPC ........... H01L 51/0035; H01L 51/0085; H01L 51/0087; H01L 51/50; H01L 51/5016; H01L 51/5036; C09K 2211/1425; C09K 2211/185
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 4,672,265 A | 6/1987 | Eguchi et al. | |
| 5,247,190 A | 9/1993 | Friend et al. | |
| 5,399,502 A | 3/1995 | Friend et al. | |
| 5,747,182 A | 5/1998 | Friend et al. | |
| 6,645,401 B2 | 11/2003 | Giles et al. | |
| 6,800,722 B2 | 10/2004 | Pei | |
| 6,830,828 B2 | 12/2004 | Thompson et al. | |
| 6,921,182 B2 | 7/2005 | Anderson, Jr. et al. | |
| 7,002,013 B1 | 2/2006 | Chi et al. | |
| 2003/0091862 A1* | 5/2003 | Tokito et al. | 428/690 |
| 2003/0186080 A1 | 10/2003 | Kamatani et al. | |
| 2003/0215669 A1 | 11/2003 | Kathirgamanathan et al. | |
| 2004/0062930 A1 | 4/2004 | Roberts et al. | |
| 2006/0093852 A1 | 5/2006 | Marsitzky et al. | |
| 2006/0199943 A1 | 9/2006 | Falcou et al. | |
| 2009/0310332 A1 | 12/2009 | Vardeny et al. | |
| 2009/0313891 A1 | 12/2009 | Vardeny et al. | |

FOREIGN PATENT DOCUMENTS

| | | |
|---|---|---|
| WO | WO 03/091355 | 11/2003 |
| WO | WO 03/102109 | 12/2003 |
| WO | WO 2005/030827 | 4/2005 |

OTHER PUBLICATIONS

Silverman et al. "The triplet state in Pt-acetylide oligomers, polymers and copolymers" Coord. Chem. Rev. vol. 249, pp. 1491-1500, 2005.*
Wong, 'Recent Advances in Luminescent Transition Metal Polyyne Polymers', Journal of Inorganic and Organometallic Polymer and Meterials, vol. 15, No. 2, pp. 197-219, Jun. 2005.
Technical Information Bulletin 'Lights and Plants Standard and Wide Spectrum Sylvania Gro-Lux Fluorecent Lamps', Copyright 2000 by Osram Sylaniva, 5, Pgs.
Office Action dated Mar. 21, 2012 for U.S. Appl. No. 12/300,424.
Restriction Requirement dated Aug. 12, 2011 for U.S. Appl. No. 12/300,424.
Office Action dated Jan. 2, 2013 for U.S. Appl. No. 12/300,424.
Davies et al., "Synthesis of Monomeric and Oligomeric Bis(acetylide) Complexes of Platinum and Rhodium" J. Chem.
Final Office Action Issued in U.S. Appl. No. 12/300,424 on Jan. 2, 2013.
International Search Report Issued in PCT Appl. No. PCT/US07/68858 mailed on Oct. 16, 2007.
Response to Restriction Requirement in U.S. Appl. No. 12/300,424 on Sep. 12, 2011.
Response to Office Action in U.S. Appl. No. 12/300,424 on Sep. 20, 2012.

(Continued)

*Primary Examiner* — Jennifer Chriss
*Assistant Examiner* — Dylan Kershner
(74) *Attorney, Agent, or Firm* — Stoel Rives LLP

(57) ABSTRACT

A polymer mixture emits a broad spectrum of visible light that appears white or near-white in the aggregate. The polymer mixture comprises two (or more) components in the active layer. A heavy atom, such as platinum and/or iridium, present in the backbone of the mixture acts via a spin-orbit coupling mechanism to cause the ratio of fluorescent to phosphorescent light emission bands to be of approximately equal strength. These two broad emissions overlap, resulting in an emission spectrum that appears to the eye to be white.

4 Claims, 5 Drawing Sheets

(56) References Cited

OTHER PUBLICATIONS

Sonogashira, Kenkichi "Development of pd-Cu Catalyzed Cross-Coupling of Terminal Acetylenes with sp2-carbon Halides" Journal of Organometallic Chemistry 653 (2002) pp. 46-49.

Wilson et al., "Triplet States in a Series of Pt-containing Ethynylenes" Journal of Chemical Physics vol. 113 No. 17 Nov. 1, 2000 pp. 7627-7634.

Written Opinion of the International Searching Authority in PCT Appl. No. PCT/US07/68858 mailed on Oct. 16, 2007.

\* cited by examiner

| | | | | | |
|---|---|---|---|---|---|
| Diethynlbenzene | C10H6 | 126.157 | 0.000987 | | |
| Bromophenylethynl-TMS | C11H13SiBr | 253.213 | 0.001975 | | |
| Diisopropylamine | | | | | |
| THF | | | | | |
| Triphenylphosphine | ph3P | | | | |
| Cuprous iodide | CuI | | | | |
| Palladium acetate | Pd(Oac)2 | | | | |
| mixed organic ingredients, added solvents, added salts + THF, stirred under argon over the weekend. Some material had pptd. Disolved in benzene (not all disolved), chromatographed over SiO2 w/ether, then benzene. | | | | | |
| bis 1,4[2-(4-[2-TMS)ethynlphenyl)ethynl]benzene | C32H30Si2 | 470.760 | | 0.465 | 0.466 | 100.3% |
| bis 1,4[2-(4-[2-TMS)ethynlphenyl)ethynl]benzene | C32H30Si2 | 470.760 | 0.000990 | | |
| Potassium hydroxide | KOH | 56.106 | 0.035847 | | |
| Methanol | | | | | |
| ether | | | | | |
| suspension of TMS cpd in ether/methanol. Added KOH, stirred 2 days. Rotary evaporated solvent, slurried in ET2O, filtered through SiO2. | | | | | |
| bis 1,4[2-(4-ethynlphenyl)ethynl]benzene | C26H14 | 326.397 | | 0.323 | 0.150 | 46.3% |
| bis 1,4[2-(4-ethynlphenyl)ethynl]benzene | C26H14 | 326.397 | 0.000460 | | |
| bis(tributylphosphine)platinum dichloride | PtC24H54P2Cl2 | 670.634 | 0.000373 | | |
| CH2Cl2 | | | 30 | | |
| diisopropylamine | | | | | |
| Benzene | | | | | |
| CuI | | | 10 mg | | |
| Disolved pt complex in benzene, added 1 drop tributylphosphine, stirred 10 min, added CHCl2, diisopropylamine, CuI, CHCl2 soln of alkyne. Stirred for approx 60 hrs. No ppt. Solution has thickened. Evaporated to dryness, taken up in CH2Cl2, chromatographed over grade 4 Al2O3. Washed 3 times w/MeOH. Thin layer on Al2O3 shows at least 5 components | | | | | |
| bis 1,4[2-(4-ethynlphenyl)ethynl]benzene / Pt | C50H66P2Pt | 824.109 | | 0.344 | 0.318 | 92.3% |

Fig-1

π-CONJUGATED HEAVY-METAL POLYMERS FOR ORGANIC WHITE-LIGHT-EMITTING DIODES

REFERENCE TO RELATED APPLICATIONS

This application claims priority from U.S. Provisional Patent Application Ser. Nos. 60/799,893 and 60/799,891, both filed May 12, 2006, the entire content of both of which are incorporated herein by reference.

GOVERNMENT SPONSORSHIP

This invention was made with government support under Grant No. DE-FG02-04ER46109 awarded by the Department of Energy. The government has certain rights in the invention.

FIELD OF THE INVENTION

This invention relates generally to organic light-emitting devices and, in particular, to π-conjugated heavy-metal polymers for white-light-emitting diodes.

BACKGROUND OF THE INVENTION

Organic light-emitting materials have great commercial potential in a number of areas, including light-emitting devices and displays. Organic materials offer potential advantages in low-cost fabrication, large-area and mechanically flexible devices, and the availability of diverse molecular-structure property relationships.

A conventional polymer electro-luminescent device comprises a thin film of electro-luminescent polymer sandwiched between two electrodes. Polymer electro-luminescent devices are described, for example, in U.S. Pat. Nos. 5,247,190 and 5,399,502 to Friend et al., in U.S. Pat. No. 4,356,429 to Tang, U.S. Pat. No. 4,672,265 to Eguchi et al., U.S. Pat. No. 4,539,507 to VanSlyke and Tang. The entire contents of these patents are incorporated herein by reference.

Efficiency is an important parameter in device design, and is related to the ratio of light energy out to electrical energy in. The quantum efficiency of a device is related to the number of photons emitted relative to the number of charge carriers introduced to the emissive material. Quantum efficiency is in turn dependent on a number of factors, which are discussed in more detail below.

If device efficiency can be increased, brighter displays are possible for the same electrical input. Alternatively, electrical input can be reduced for the same light output, which saves energy and may increase the lifetime of the display, another important design parameter.

Conjugated polymers are often used in organic electro-luminescent devices. These polymers typically comprise a backbone having alternating single and double carbon-carbon bonds, such that extensive electron delocalization occurs. When polymers of this type are used as conducting polymers, an oxidizing agent may be added to remove an electron from a polymer double bond. The remaining lone electron, associated with a positive charge due to the removal of an electron, can then propagate along the polymer chain under the influence of an electric field. This propagating charge is known as a polaron. Reducing agents may be used to donate additional electrons to the chain, which may also propagate along the chains as polarons.

In electroactive devices using conjugated polymers, a polymer film is typically in contact with two electrodes. Electrons are injected into the polymer at one electrode, and electrons are withdrawn from the polymer at the other electrode. The withdrawal of electrons is usually termed hole injection, as the absence of the electron, or hole, propagates in the manner of a positively charged charge carrier. The injected electrons propagate as negative polarons, the injected holes propagate as positive polarons. Electro-luminescence may occur due to the interaction of positive and negative polarons, as discussed below. This interaction may sometimes be termed recombination or annihilation of carriers.

Within the organic layer, charge-transfer (CT) reactions occur between a positively charged polaron ($P^+$) and a negatively charged polaron ($P^-$). The polarons are associated with two participating locations (such as polymer chain segments), and each polaron has spin ½. The interaction between the two oppositely charged polarons leads to the formation of an intermediate encounter complex, involving both locations, and then to the formation of a final state. The final state comprises the ground state of one participant and an excited state of the other participant. The excited state may be either a neutral exciton singlet state (S) or a neutral exciton triplet state (T). Light emission occurs only for singlet exciton decay.

The current state of the art devices for white lighting are incandescent light bulbs (7 to 22 lumens per watt—efficiency about 2.5%), fluorescent lamps (efficiency about 11%) and LED devices. There are no LEDs with a broad spectral emission. Current technology "white" LEDs use separate emitters of red, green and blue light. Each of these emitters has a rather narrow emission, and they overlap poorly, so the output light appears tinted, usually toward the blue spectrum. Other attempts to prepare white light emitting devices involve preparing mixtures or layers of materials that emit in several different bands. This requires complex energy transfer mechanisms between layers or components and greatly complicates fabrication of these devices.

SUMMARY OF THE INVENTION

In accordance with this invention, a polymer mixture has been synthesized and characterized which, upon photoexcitation, emits a broad spectrum of visible light that, in the aggregate, appears white. The polymer mixture comprises two (or more) components in the active layer. In addition, a heavy atom, such as platinum and/or iridium, present in the backbone of the mixture acts via a spin-orbit coupling mechanism to cause the ratio of fluorescent to phosphorescent light emission bands to be of approximately equal strength. These two broad emissions overlap, resulting in an emission spectrum that appears to the eye to be white.

BRIEF DESCRIPTION OF THE DRAWINGS

FIG. 1 is a chart that shows experimental data associated with the invention;

DETAILED DESCRIPTION OF THE INVENTION

Figure 2:
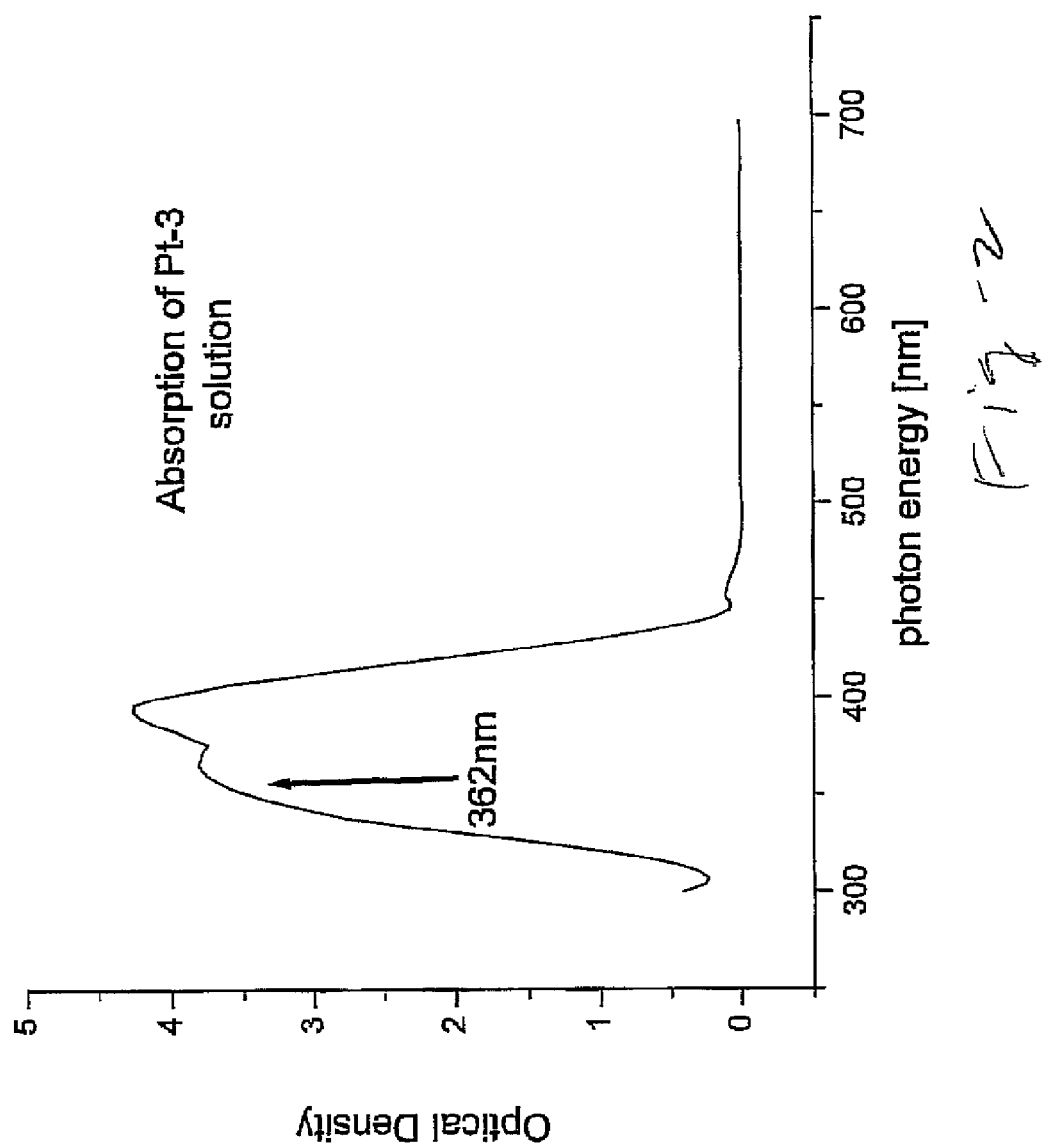
FIG. 2 shows the absorption of Pt-3 (solution) along with excitation at 362 nm.

Organic light-emitting polymers are well known in the art to comprise polymers having a high degree of π conjugation along their backbones. These polymers are electrically conducting, and as further known in the art, the light emission which they are capable of producing may be controlled and tailored by controlling the degree of conjugation of the π electrons, as well as by controlling the nature and number of organic side groups on the polymer backbone. As described hereinabove with reference to the present invention, further enhancement and control of the light emission may be had by incorporating metals into the light-emitting polymers. These metals are, in particular instances, heavy metals; and, noble metals comprise one particular group of heavy metals which may be utilized in the present invention.

In view of this teaching, one of skill in the art could readily synthesize the metal-containing, π-conjugated, light-emitting polymers of the present invention without undue experimentation. Methods and techniques for the preparation of such polymers are well documented.

By way of example, and not limitation, one particular synthesis of a metal-containing, π-conjugated polymer having utility in an organic light-emitting device will be described. In the first step of the preparation of the material, a mixture of diethynlbenzene, bromophenylethynl-TMS, diisopyropylamine and triphenylphosphine were mixed together. Cuprous iodide and palladium acetate were added to the mixture along with tetrahydrofuran (THF). This mixture was stirred under argon over the course of a few days. This resulted in a formation of some precipitate. The reaction mixture was dissolved in benzene, and analyzed and found to comprise the reaction product bis-1,4[2-(4-(2-TMS)ethylnphenyl)ethynl] benzene ("the TMS compound").

The TMS compound thus prepared was suspended in a methanol/ether solvent. Potassium hydroxide was added and this mixture stirred for two days. Thereafter, the solvent was removed by rotary evaporation and the resultant product slurried in ethyl ether and filtered through silica. Evaporation of the ether yielded a reaction product which was identified as bis-1,4[2-(4-ethylphenyl)ethynl] benzene ("the BIS 1,4 compound").

The thus prepared BIS 1,4 compound was dissolved in methylene chloride. A platinum complex comprising bis-(tributylphosphine) platinum dichloride was dissolved in benzene. One drop of tributylphosphine was added and the mixture stirred for 10 minutes. Diisopyropylamine dissolved in methylene chloride was then added along with copper iodide into the solution of the BIS 1,4 compound. This mixture was stirred for approximately 60 hours. The solution thickened over that time, but no precipitate was formed. The solvent was evaporated to dryness, and the resultant solid dissolved in methylene chloride, precipitated and washed with methanol. The result of the synthesis was incorporation of platinum into the BIS 1,4 compound.

In keeping with the foregoing general procedure, it will be appreciated that the amount of platinum incorporated into the compound may be controlled by controlling the amount of platinum complex utilized in the reaction scheme. It will also be understood that one of skill in the art could readily substitute other organic compounds, inorganic compounds and organo compounds into the foregoing procedure so as to produce various materials.

As is known and apparent to those of skill in the art, organic light-emitting devices may be readily fabricated by coating the thus prepared materials onto the electrically conductive substrates such as glass coated indium tin oxide and the like. Materials and devices prepared in accordance with the foregoing secure the particular advantages of high output and tunable emissions so that a selected wavelength or band of wavelengths may be readily achieved through the use of relatively simple, heavy metal-containing polymer materials, which in some cases may be mixtures of several polymers having different outputs, or a single polymer having a tailored output.

The heavy atom acts to enhance phosphorescent emission which might otherwise not be seen at all. The invention allows for the chemical tuning of the emission bands through the placement of different spacers between adjacent Pt atoms in the polymers. The relative strengths of the phosphorescence to the luminescence may also be tuned by diluting the heavy atoms present in the chain; say, from one Pt atom on each monomer, to Pt atoms on every 3, 5, 7, etc.

Figure 3:
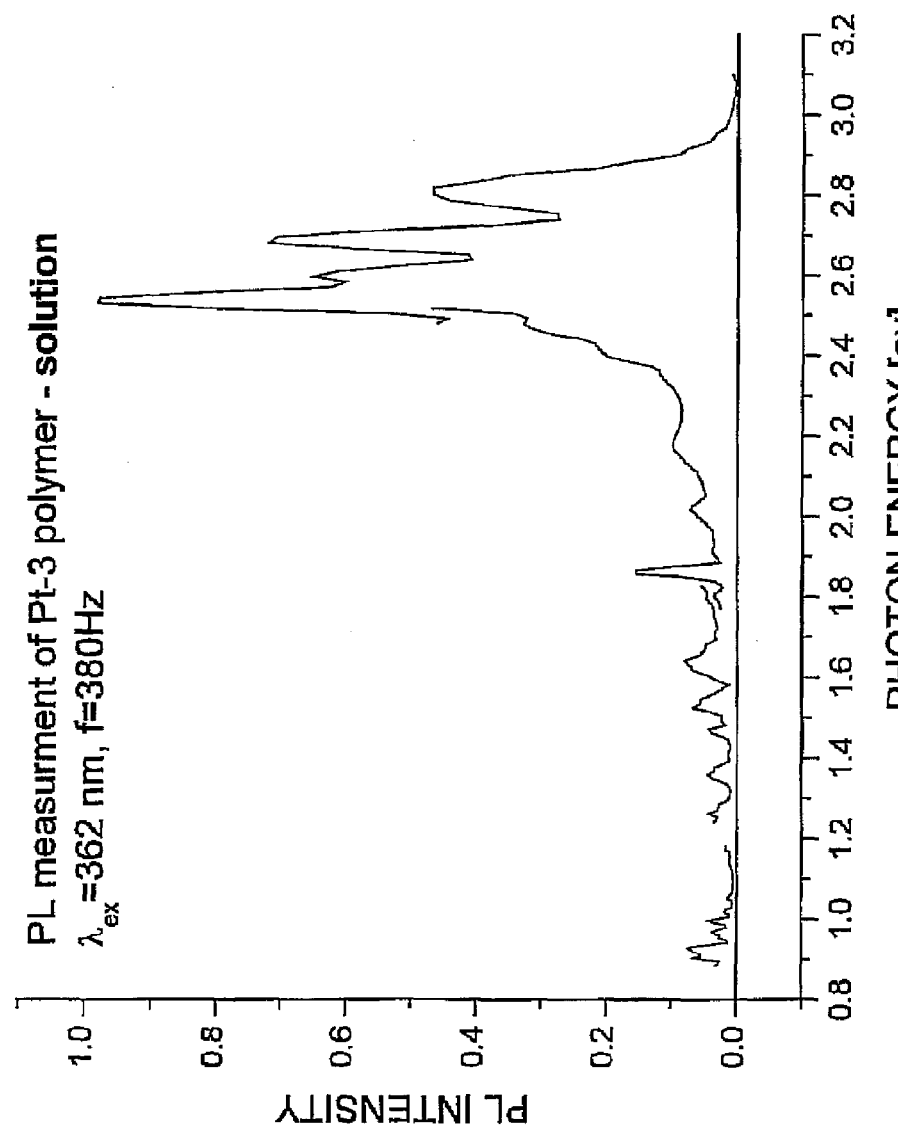
FIG. 3 is a plot of a photoluminescent measurement of a polymer (Pt-3) solution according to the invention.
Figure 4:
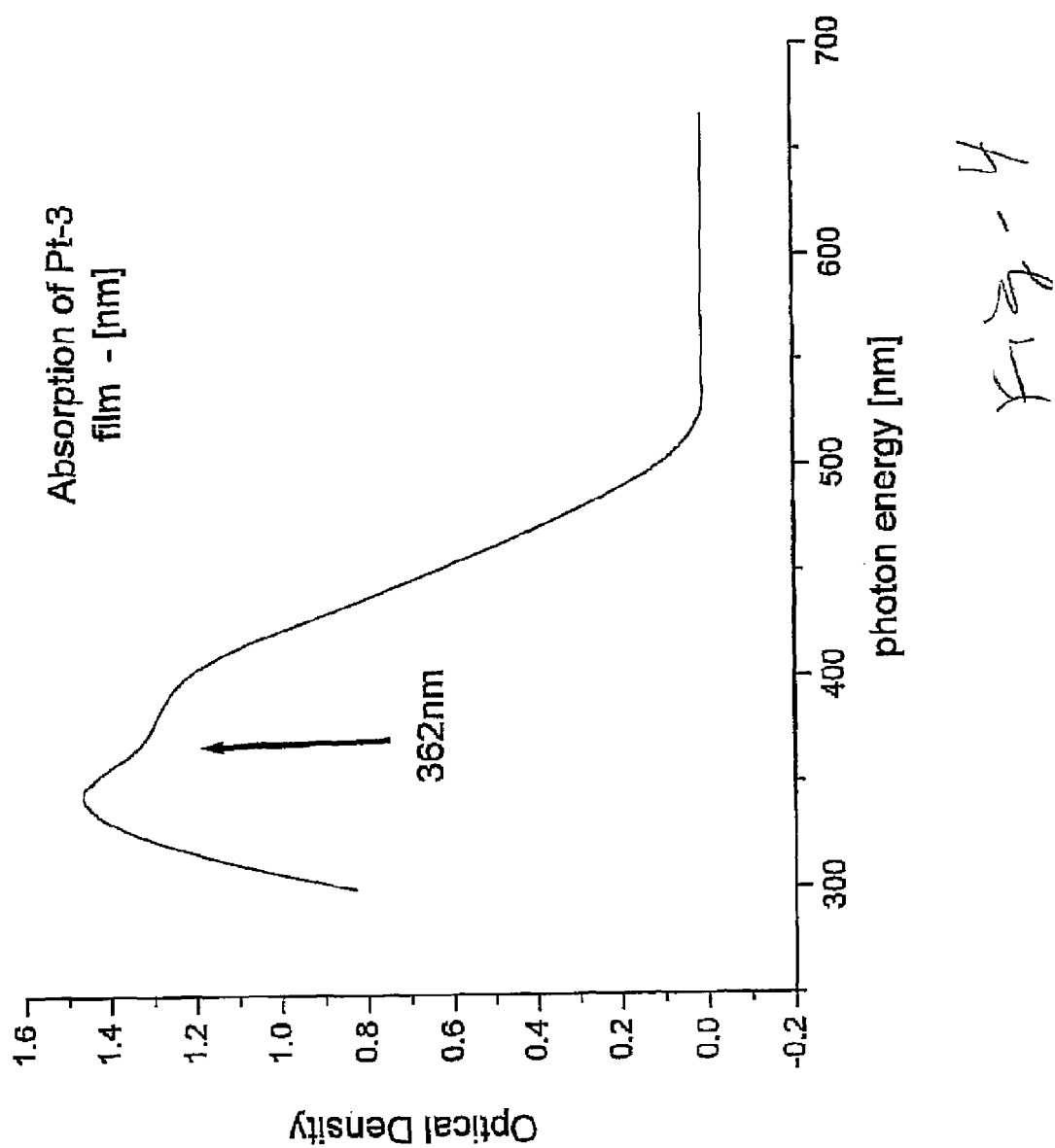
FIG. 4 is a plot of photoluminescent measurement of Pt-3 polymer film.
Figure 5:
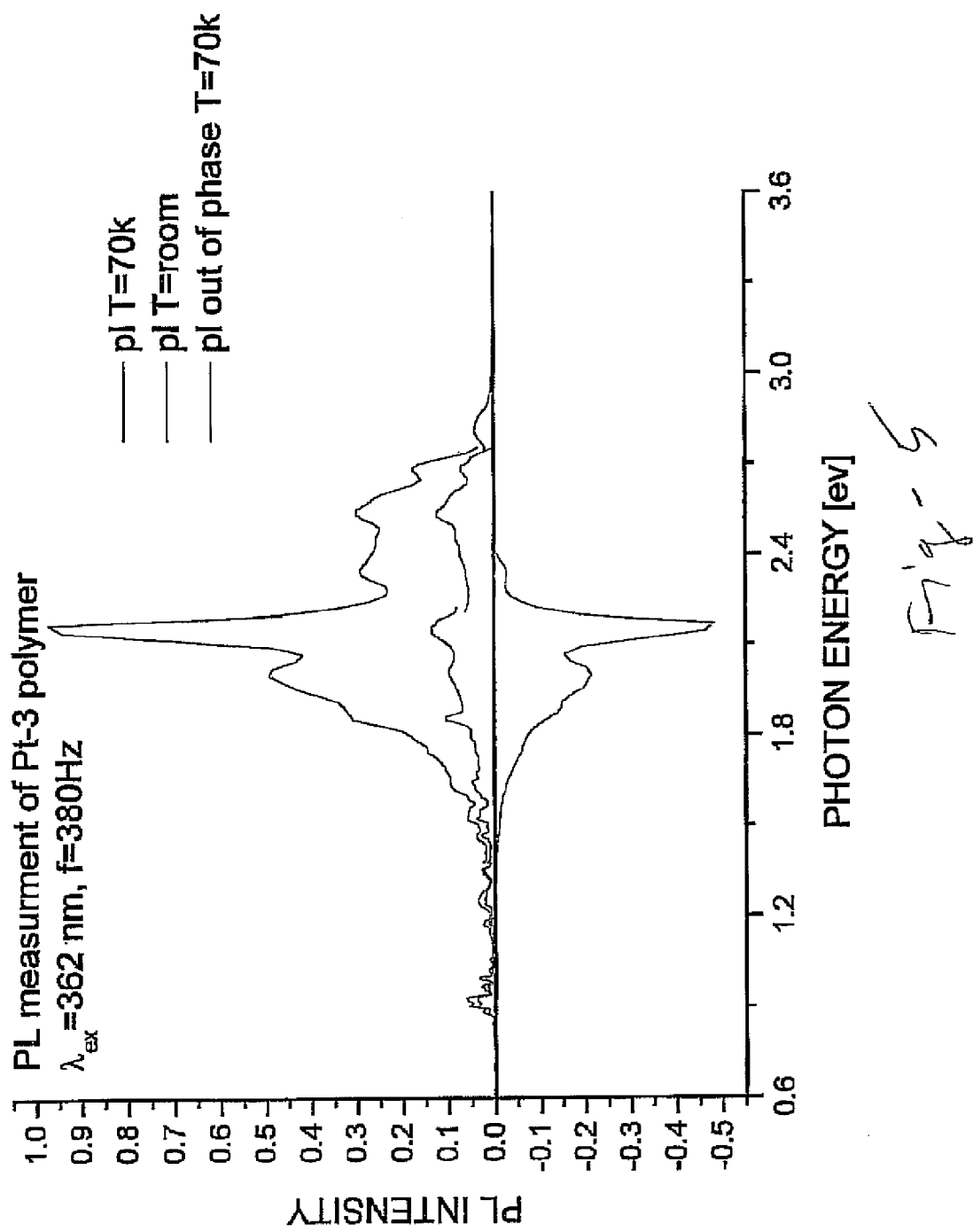
FIG. 5 is a plot of photoluminescent measurement of Pt-3 polymer at different temperatures and phase variation.

FIG. 1 is a chart that shows experimental data associated with the invention. FIG. 2 shows the absorption of Pt-3 (solution) along with excitation at 362 nm. FIG. 3 is a plot of a photoluminescent measurement of a polymer (Pt-3) solution according to the invention. FIG. 4 is a plot of photoluminescent measurement of Pt-3 polymer film, and FIG. 5 is a plot of photoluminescent measurement of Pt-3 polymer at different temperatures and phase variation.

The polymer mixture can be used as the active layer in white organic-light-emitting diodes (WOLEDs) that give a natural spectrum for home and commercial lighting. The resulting material facilitates the fabrication of low-power lighting devices that, if widely applied to replace conventional incandescent and fluorescent lamps, could significantly decrease national energy consumption. This material could also be used for making WOLED displays.

Such a soluble polymer material has great advantage for manufacturing such devices: 1) It affords simple fabrication methods in that it can be applied by spin coating, silk screening, dipping etc.; it can conform to any shape; 2) Device construction of a WOLED is simplified, since it would consist of a single active layer and therefore fewer processing steps and electrical connections are required compared to current multi-layer, multi-material devices.

We claim:

1. An organic light-emitting diode (OLED), comprising:
    an active layer including a π-conjugated polymer backbone; and
    a plurality of heavy metal atoms in the backbone causing fluorescent to phosphorescent emission bands to overlap upon excitation, wherein each of the heavy metal atoms is iridium;
    wherein the π-conjugated polymer backbone consists of the iridium atoms separated by spacers consisting of at least three unsubstituted phenyl groups connected by ethynyl linker groups;
    wherein the spacers have the structure -Et-(Ph-Et-)$_n$-, with each -Et- being ethynylene, each -Ph- being a para-linked unsubstituted phenylene, and n=3, 5 or 7.

2. The OLED of claim 1, wherein the emission bands are chemically tuned through the placement spacers of different length between adjacent iridium atoms in the backbone.

3. The OLED of claim 1, wherein the active layer comprises a single polymer having a π-conjugated polymer backbone.

4. The OLED of claim 1, wherein the active layer comprises a mixture of two or more polymers having a π-conjugated polymer backbone.

* * * * *